United States Patent

Kelly et al.

[11] Patent Number: 5,266,953
[45] Date of Patent: Nov. 30, 1993

[54] ADAPTIVE FIXED-THRESHOLD PULSE TIME-OF-ARRIVAL DETECTION APPARATUS FOR PRECISION DISTANCE MEASURING EQUIPMENT APPLICATIONS

[75] Inventors: Robert J. Kelly, Baltimore; Michael G. Biggs, Catonsville; Howard H. Ireland, Abingdon; Gary A. Drutch, Ellicott City; Janice A. Winter, Sparks, all of Md.

[73] Assignee: Allied-Signal Inc., Morris Township, Morris County, N.J.

[21] Appl. No.: 739,074

[22] Filed: Aug. 1, 1991

[51] Int. Cl.$^5$ .............................. G01S 13/08
[52] U.S. Cl. .................... 342/47; 364/569; 307/518
[58] Field of Search .......... 364/569, 514, 517, 450; 342/47, 33, 35, 36, 118, 125, 134; 307/361, 228, 246, 518; 328/132, 147

[56] References Cited

U.S. PATENT DOCUMENTS

| | | | |
|---|---|---|---|
| 3,754,252 | 8/1973 | Sanders | 343/6.5 |
| 3,997,898 | 12/1976 | LeGrand | 343/6.5 R |
| 4,010,465 | 3/1977 | Dodington et al. | 343/5 LS |
| 4,492,961 | 1/1985 | Koller et al. | 342/47 |
| 4,568,942 | 2/1986 | Letocquart | 343/408 |
| 4,635,064 | 1/1987 | Chisholm | 342/408 |
| 4,646,097 | 2/1987 | King | 342/134 X |
| 4,648,101 | 3/1987 | Hamzaoui et al. | 375/99 |
| 4,670,756 | 6/1987 | Lopez | 342/372 |
| 4,677,442 | 6/1987 | Enein | 342/410 |
| 4,680,722 | 7/1987 | Tomasi | 364/569 |
| 4,723,126 | 2/1988 | Chisholm | 342/408 |
| 4,757,320 | 7/1988 | Letoquart et al. | 342/410 |
| 4,890,110 | 12/1989 | Kuwahara | 342/35 |
| 4,912,479 | 3/1990 | Nishimura et al. | 342/408 |
| 4,916,451 | 4/1990 | Ishita | 342/35 |
| 4,990,921 | 2/1991 | Chisholm | 342/35 |
| 5,032,840 | 7/1991 | Hethuin | 342/35 |
| 5,121,413 | 6/1992 | Voegtly et al. | 307/518 X |

Primary Examiner—Mark Hellner
Attorney, Agent, or Firm—Howard G. Massung

[57] ABSTRACT

An apparatus to be employed within a precision distance measuring system for estimating pulse time-of-arrival. The apparatus facilitates the use of an Adaptive Fixed Threshold method for such estimation. The invention compensates for pulse time detection errors induced by variations in incident pulse amplitude and shape by adjusting the estimated time-of-arrival. This adjustment is performed as a function of the measured pulse slope between two low-amplitude threshold levels through the use of a predetermined reference table of error adjustment times.

3 Claims, 9 Drawing Sheets

ADAPTIVE FIXED-THRESHOLD PULSE TIME-OF-ARRIVAL DETECTION APPARATUS FOR PRECISION DISTANCE MEASURING EQUIPMENT APPLICATIONS

BACKGROUND OF THE INVENTION

The present invention provides an improved pulse time-of-arrival detection apparatus for use with precision distance measuring systems. More particularly, this invention relates to a fixed-threshold pulse time-of-arrival detector which is adaptively responsive to incoming pulse waveforms in a manner which enhances the detector's ability to minimize multipath induced errors.

Distance Measuring Equipment ("DME") is associated with enroute and terminal area navigation, as well as nonprecision navigational techniques. Precision DME systems are designated "DME/P," while the nonprecision DME systems are referred to as "DME/N." One application for DME/P is as an integral element of the Microwave Landing System for aircraft Within the Microwave Landing System, DME/P performs a precision ranging function which complements the azimuth and elevation guidance functions of the Microwave Landing System.

Presently, two accuracy standards exist for DME/P systems; a 100 foot standard ("Accuracy Standard 1"), and a 40 foot standard ("Accuracy Standard 2"). To qualify under either of these standards, a DME/P system must be able to provide range information to a distant DME interrogator, within the specified tolerance, while overcoming errors induced by specular multipath, garble interference, diffuse multipath receiver noise, and instrumentation deficiencies. Today, only systems meeting the Accuracy Standard 1 requirements have been implemented and flight tested. However, the development of a DME/P system capable of achieving Accuracy Standard 2 is crucial, as such a system would allow a Microwave Landing System to expand its operational benefits to include Category II and Category III Computed Centerline Approaches (Category III is a weather condition defined by the International Civil Aviation Organization ("ICAO") having a ceiling of zero and very limited visibility, and Category II is a weather condition having a ceiling of approximately 100 feet with improved visibility). An Accuracy Standard 2/Microwave Landing System would be of particular value in applications involving short runways or runways with large DME/P offsets. Most importantly, Accuracy Standard 2 is necessary to permit a Microwave Landing System to direct an Area Navigation (RNAV) Short Turn-On-To-Final Approach landing. In such a landing, the straight-in portion of the Final Appproach is approximately one nautical mile in length. Systems meeting Accuracy Standard 1, regardless of the landing minimum, cannot satisfy the Path Following Error (PFE) or the Control Motion Noise (CMN) requirements for directing such a landing.

The primary source of error in DME/P systems is specular multipath, and the element most critical within a DME/P system for reducing specular multipath error (and therefore achieving Accuracy Standard 1 tolerances) is the pulse time-of-arrival ("TOA") detector. Prior art TOA systems have employed TOA detectors which use a Delay-Attenuate-Compare ("DAC") technique to provide an estimate of pulse arrival time. TOA detector multipath performance is evaluated as function of error vs. multipath delay, and, as shown in FIG. 1, a DAC TOA detector has an error of approximately 25 feet for a 100 ns multipath delay time. When this TOA detector error is combined with errors from other sources within the Microwave Landing System, the total system error exceeds 40 feet.

DME/P accuracy is achieved by thresholding low on the pulse leading edge at a time before the multipath arrives, and making the pulse arrival time processor independent of pulse amplitude and pulse shape variations. Because of its simplicity, a natural candidate for such a TOA detector is one employing a simple fixed threshold technique. However, the pulse arrival time processor for such a detector is not independent of pulse amplitude and pulse shape variations. This is true whether an automatic gain control or log receiver is applied.

For example, assume a linear receiver wherein threshold is defined by:

$$\text{Threshold} = \frac{V}{t_{RT}} TOA_M, \tag{1}$$

where $t_{RT}$ is the 10% to 90% pulse rise time, V is the peak pulse amplitude, and $TOA_M$ is the time that the pulse leading edge crosses the threshold. Further assume that the fixed threshold is within the linear region defined by the DME/P partial rise time specification of 5% to 30%. Let threshold=0.1 V and assume that tm=1000 ns. (ICAO requires that the pulse waveforms have rise times between 800 ns and 1200 ns.)

The virtual origin (or the start of the pulse) $t_{vo}$, is obtained by solving the above equation for $t=t_{vo}$, which yields:

$$t_{vo} = \text{Threshold}\left[\frac{t_{RT}}{V}\right]. \tag{2}$$

Taking the differential of equation (2), the pulse arrival time error due to pulse shape and pulse amplitude is:

$$\Delta t = \text{Threshold}\left[\frac{\Delta t_{RT}}{V} - \frac{t_{RT}}{V^2}\Delta V\right]. \tag{3}$$

Thus, a rise time error $\Delta t_{RT}$ of 200 ns, and an amplitude error $\Delta V$ of $-0.1$ V, can result in a 30 ns TOA estimation error. Clearly, such a linear receiver would not be practical for use in a low error Microwave Landing System as a sizable portion of the Accuracy Standard 1 error budget is consumed by only the small amplitude and wave shape variations evident in the incoming pulse.

It is desirable then to employ a pulse arrival technique which is invariant to pulse amplitude and shape variation. Such an implementation is the DAC technique is described in Kelly, R. J., "System Considerations for the new DME/P International Standard," IEEE Trans. Aerospace, Electronic System AES-20, Nov. 1, 1984. A DAC technique system, using a 100 ns and $-6$ dB attenuation, is the industry standard. Such systems have been simulated, built and successfully flight tested, and have achieved Accuracy Standard 1. However, the DAC technique does not provide the precision necessary to satisfy Accuracy Standard 2.

Accordingly, it is the object of the present invention to provide for a TOA estimator employing a method of detection which reduces multipath error and enables Microwave Landing Systems to achieve an overall accuracy which will satisfy Accuracy Standard 2. This accomplished by employing an Adaptive Fixed Threshold ("AFT") technique TOA estimator.

SUMMARY OF THE INVENTION

The invention provides for an Adaptive Fixed Threshold TOA estimator apparatus which yields an error-corrected estimate of the pulse time-of-arrival. The invention compensates for pulse time detection errors induced by variations in incident pulse amplitude and shape by adjusting the estimated time-of-arrival. This adjustment is performed as a function of the measured pulse slope between two low-amplitude threshold levels, by employing a predetermined reference table of error adjustment times. The reference table is based upon previously collected experimental data.

BRIEF DESCRIPTION OF THE DRAWINGS

The above and other objects and advantages of this invention will be apparent on consideration of the following detailed description, taken in conjunction with the accompanying drawings, in which like reference characters refer to like parts throughout, and in which.

DETAILED DESCRIPTION OF THE INVENTION

Figure 1:
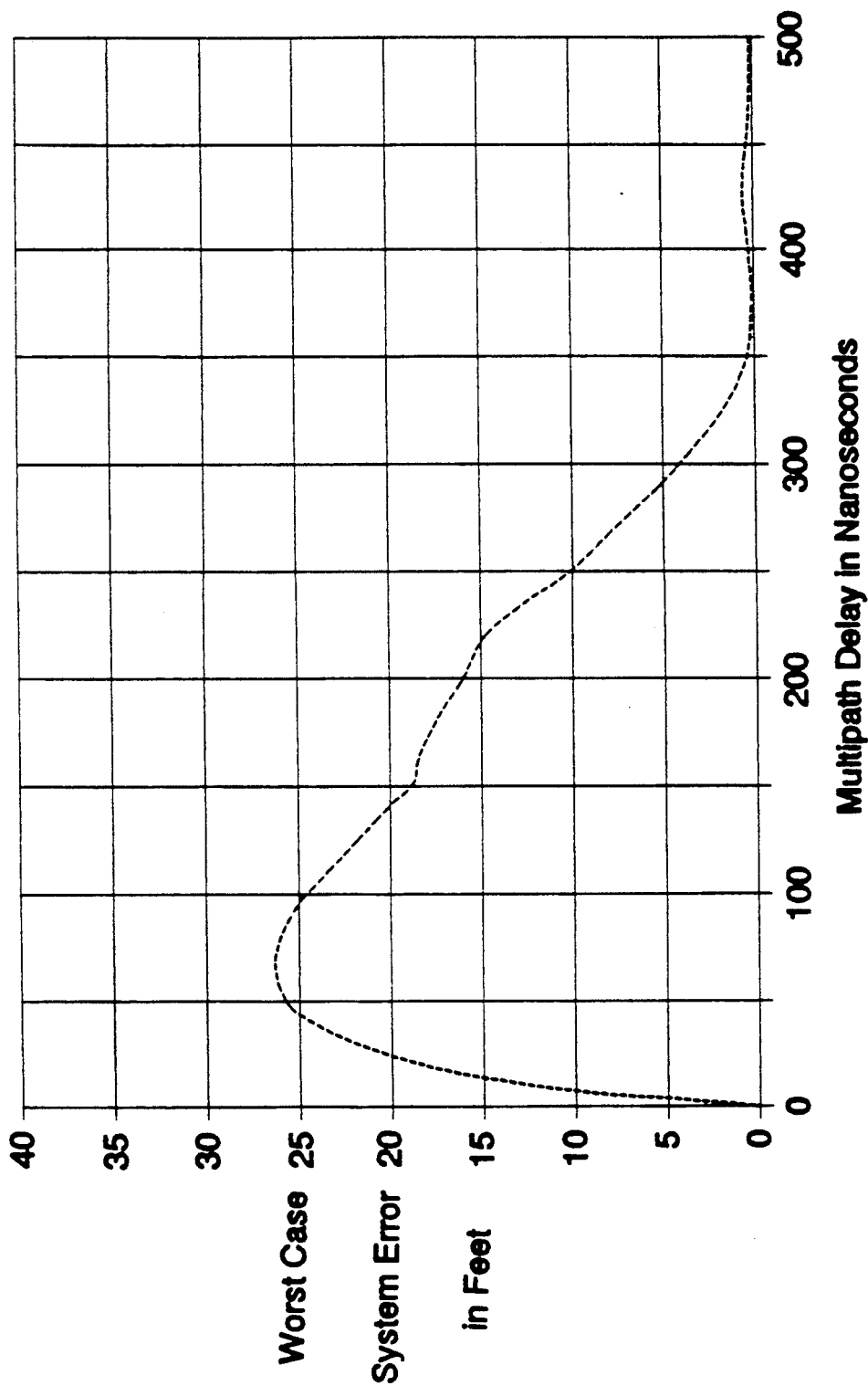
FIG. 1 is a graph showing worst case system error as a function of multipath delay for a DAC pulse time-of-arrival estimator.

The instant invention removes the performance weakness associated with the fixed threshold technique of pulse TOA estimation. This is accomplished by measuring the slope of an incident pulse leading edge in the vicinity of the fixed threshold, and using this measured slope to determine the adjustment time, $\Delta TOA$, and therefore the appropriate adjustment to be made to the measured pulse TOA. This is described by:

$$\overline{TOA} = TOA_M \Delta TOA; \quad (4)$$

where $\overline{TOA}$ is the estimated TOA. TOA adjustment time is computed as a function of the variation of the measured slope, $S_M$, from that of a predetermined reference slope, $S_R$, given by:

$$S_M = \frac{V}{t_{RT}}. \quad (5)$$

The reference slope is related to the slope deviation, $\Delta S$, as follows:

$$\Delta S = S_M - S_R. \quad (6)$$

TOA error is a function of the pulse leading edge rise time in the vicinity of the fixed threshold, and, most importantly, the majority of error perturbations in the vicinity of this threshold are linear piecewise functions. This linearity is the result of the bandwidth limiting of the intermediate frequency output by the 4 Mhz Final Approach mode filter. Thus, barring specular multipath induced errors, the pulse leading edge may be modeled as the superposition of piecewise linear functions having a linear slope differing from the reference slope by a simple proportionality constant of $(1 \pm \Delta S_R)$. This relation can be demonstrated by taking the differential of equation (1), yielding:

$$0 = \Delta S(TOA_M) + S_M(\Delta TOA), \quad (7)$$

and $$\Delta TOA = -TOA_M \left[ \frac{\Delta S}{S_M} \right]. \quad (8)$$

As shown above the measured value of the slope deviation ($\Delta S$) can be used to determine the TOA error ($\Delta TOA$), which, in turn, is added to the detected TOA ($TOA_M$) to obtain the corrected estimated TOA. Both amplitude deviations ($\Delta V$), and pulse shape deviations ($\Delta t_{RT}$) contribute to the slope deviations $\Delta S$, as is shown by taking the differential of equation (4), which yields:

$$\Delta S = S_M \left[ \frac{\Delta V}{V} - \frac{\Delta t_{RT}}{t_{RT}} \right]. \quad (9)$$

Figure 2:
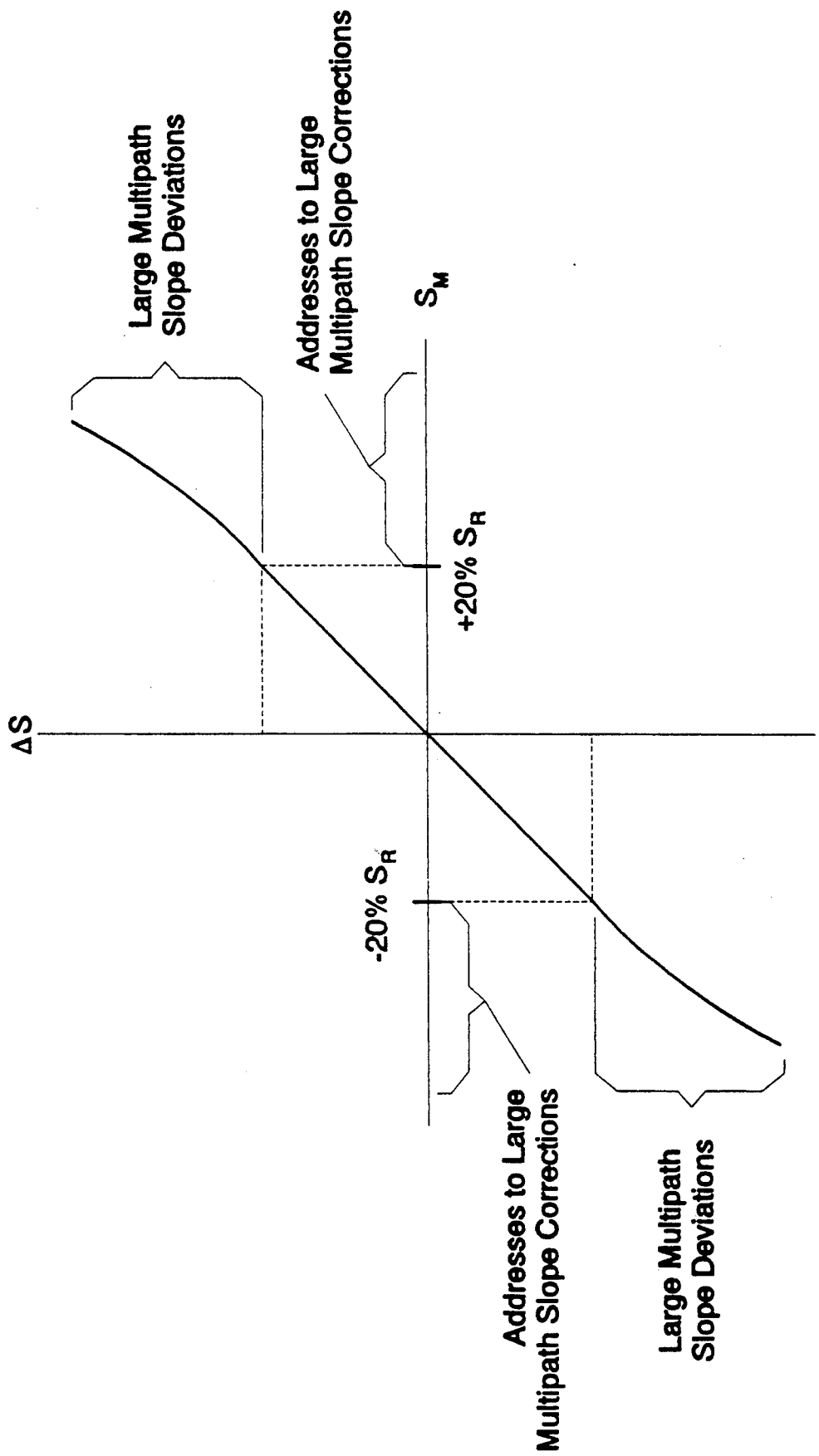
FIG. 2 is a graph illustrating the slope error introduced as a result of specular multipath.

Equations (4), (8) and (9) show that amplitude and pulse shape deviations can be accurately compensated for based upon the measured detection time and the measured slope of the input pulse. However, it is not capable of properly characterizing errors due to specular multipath. Since specular multipath introduces pulse shape deviations greater than 20% of the magnitude of the reference pulse slope, these errors cannot be easily approximated using piecewise, linear methods (see FIG. 2). Because the DME/P interference environment is well defined, all slope variations sensed by the reference module which exceed ±20% are assumed to be the result of specular multipath, and the TOA errors associated with such variations are compensated for via nonlinear correction functions compiled as a result of experimental measurements. These correction functions being related to pulse slope deviation from the reference pulse slope; either by a linear proportionality constant or a higher order function. It is this relationship which provides the fundamental basis for the instant invention.

Figure 3:
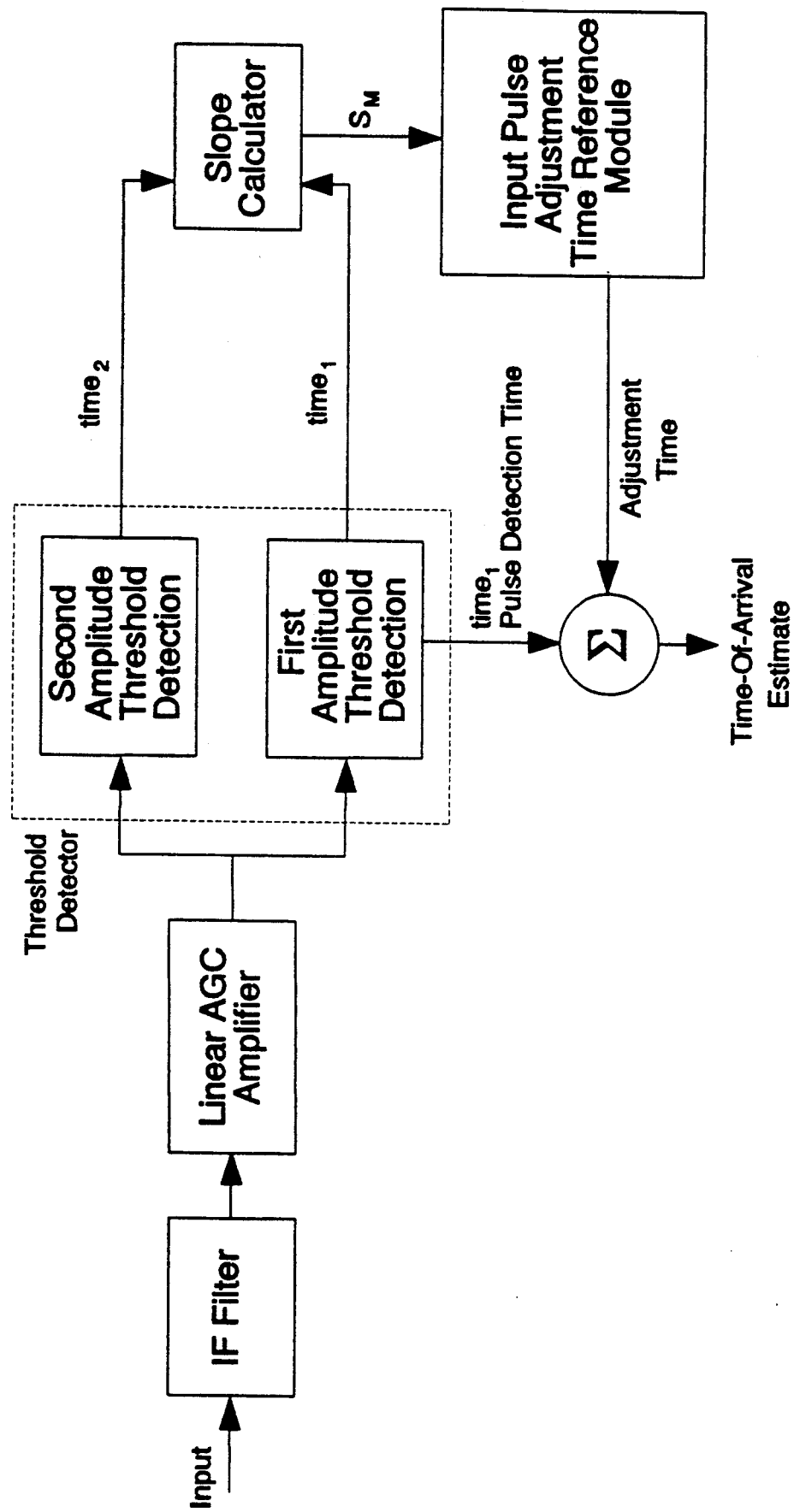
FIG. 3 is a block diagram of an AFT pulse time-of-arrival estimator.

One embodiment of the invention (illustrated in FIG. 3) provides for a TOA estimator which accepts a DME/P pulse waveform at an input port. The pulse is then fed through a narrow-band intermediate filter (known as a Final Approach mode filter) and an automatic gain control amplifier. Together, the filter and amplifier serve to regulate the amplitude of incoming pulses to $\pm 1$ dB ($\Delta V = \pm 0.1$ V). The result is a normalized pulse waveform.

The normalized pulse waveform is then fed to a threshold detector, having the ability to detect both a first and second amplitude threshold levels ($A_1$ and $A_2$). The detector is calibrated so that these two levels are relatively low when compared to the peak amplitude of the amplified and filtered pulse. The first detector level is set at an amplitude high enough to eliminate any unwanted delays introduced by the filter from interfering with the measurement of the pulse waveform. The second detector level is set above that of the first detector, but still at a level low enough so that is reached early on in the pulse waveform. This serves to minimize interference from any multipath effects. Typically, all of the above conditions can be met if the first level is set to 10% of peak pulse amplitude, and the second level is set to 16% of peak pulse amplitude.

The threshold detectors output the times at which each of the predetermined amplitude levels were reached (time$_1$ and time$_2$) to a slope calculator. This calculator computes the slope of the pulse waveform between the first and second amplitude levels, and outputs the result to an input pulse adjustment time reference module. The reference module accepts the slope information, compares it to stored reference slope values, and then searches a stored reference data table of pulse adjustment times (generated as a result of previous measurements) to find the adjustment tim associated with the amount of deviation between the calculated pulse slope and the reference pulse slope.

The adjustment time output from the reference module is then added to the value of the first threshold detection time, time:. This is done as the first detection time approximates the time at which pulse arrival was detected; time$_1 \approx t_{vo}$. The resulting sum is the corrected pulse time-of-arrival estimate.

Figure 4A:
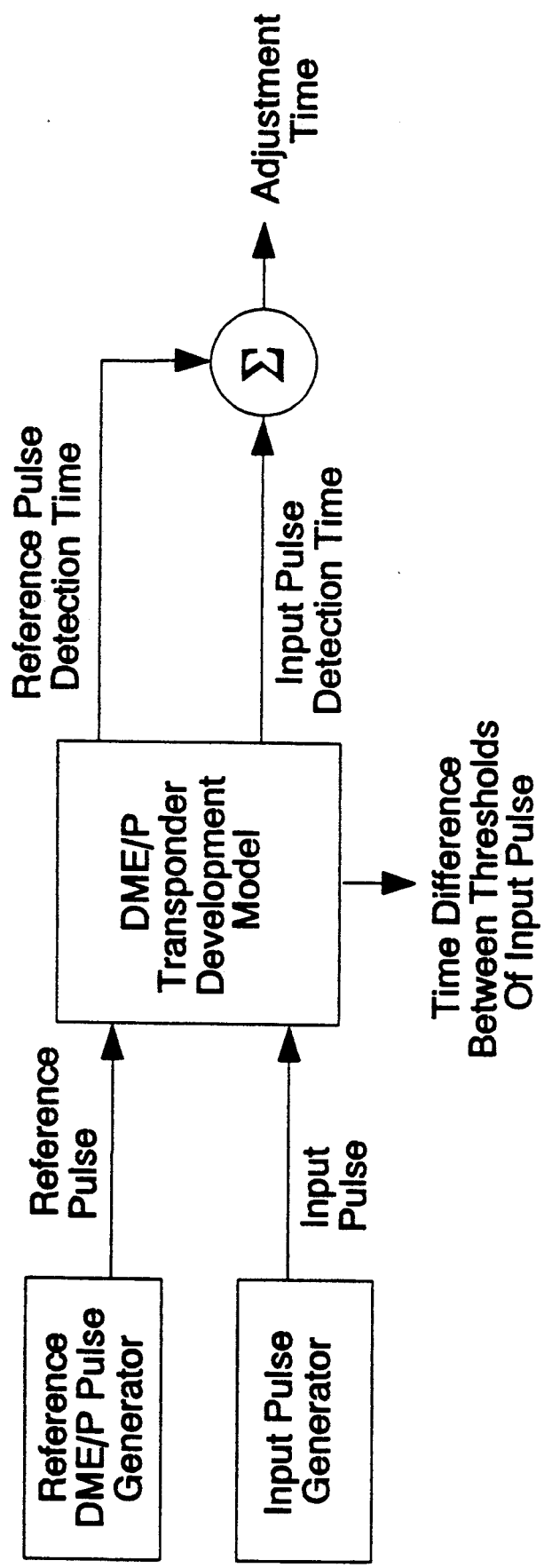
FIG. 4A is a block diagram of a system for collecting data for a slope error/time adjustment reference table.
Figure 4B:
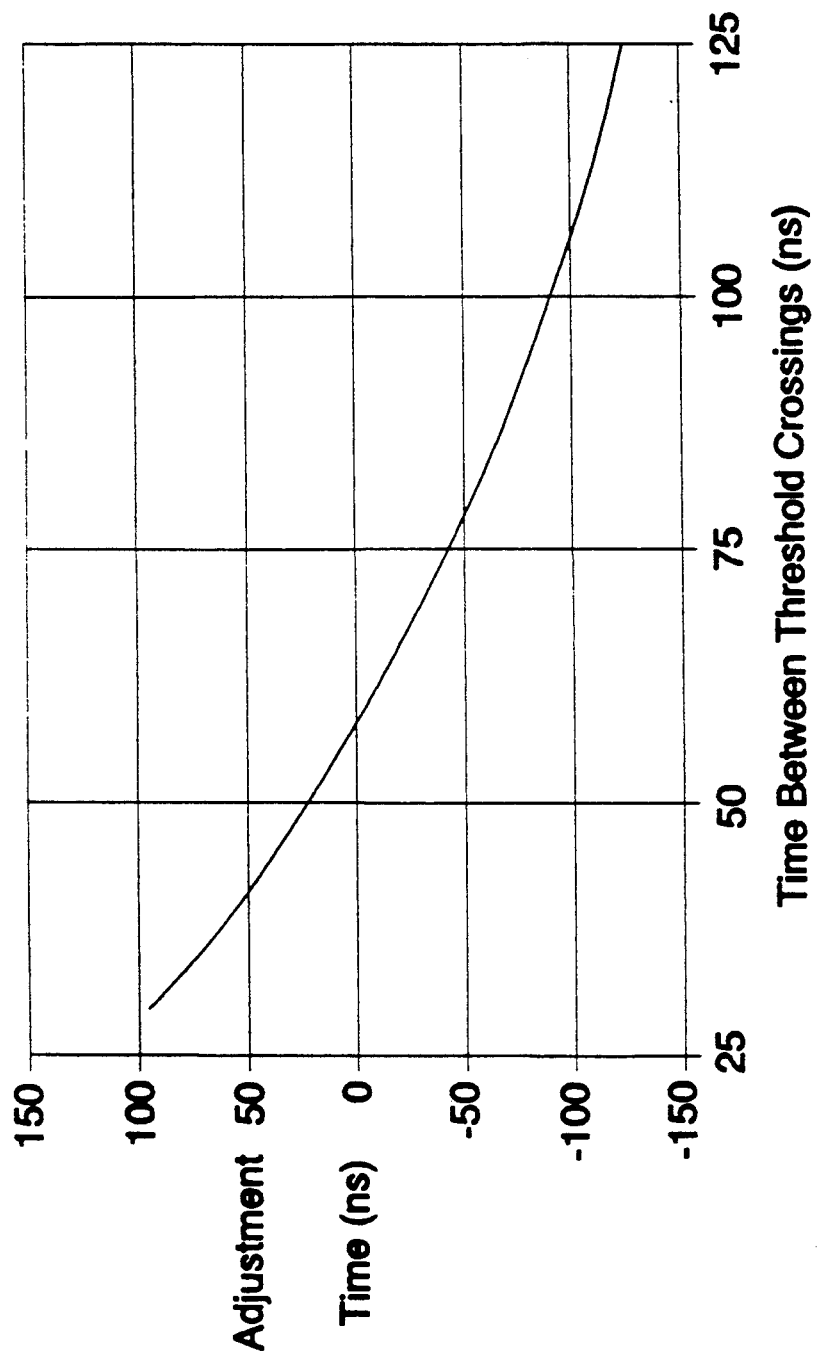
FIG. 4B is a graph illustrating a third-order polynomial curve fit to approximate the data collected via the system depicted in FIG. 4A.
Figure 5:
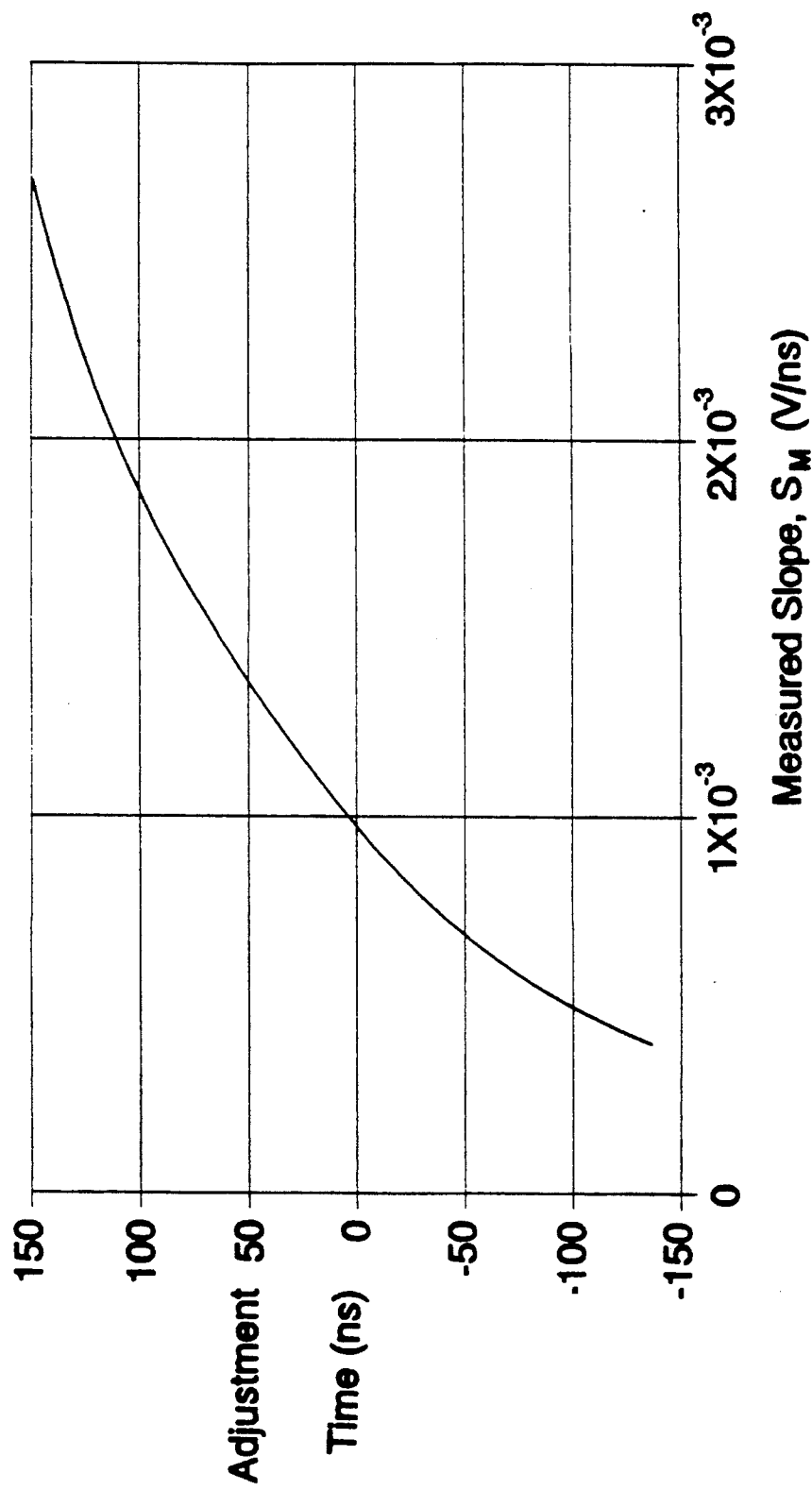
FIG. 5 is a graph illustrating a function relating measured slope to pulse adjustment time.
Figure 6:
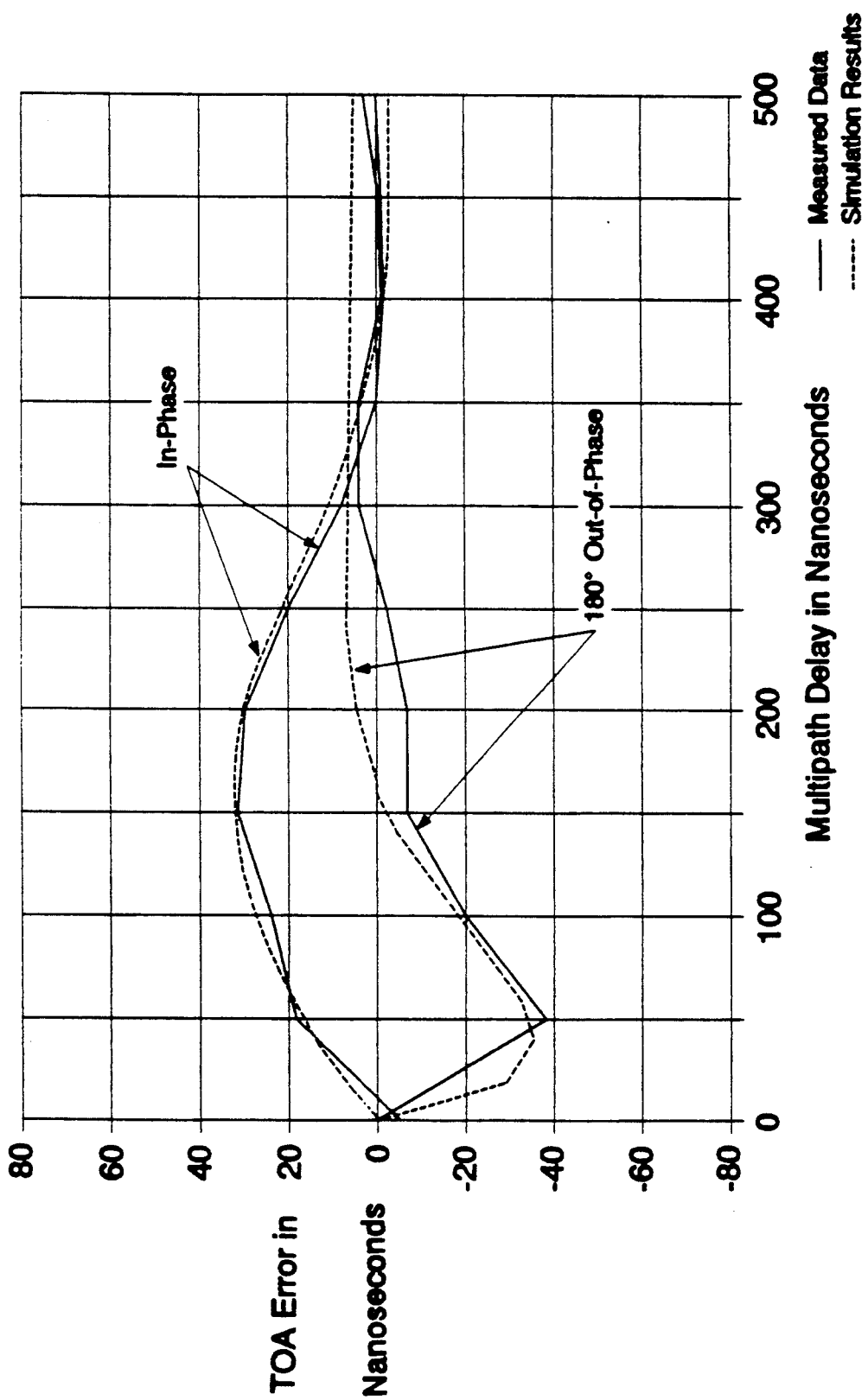
FIG. 6 is a graph showing both the measured and simulated $-3$ dB multipath performance characteristics of an AFT estimator.
Figure 7A:
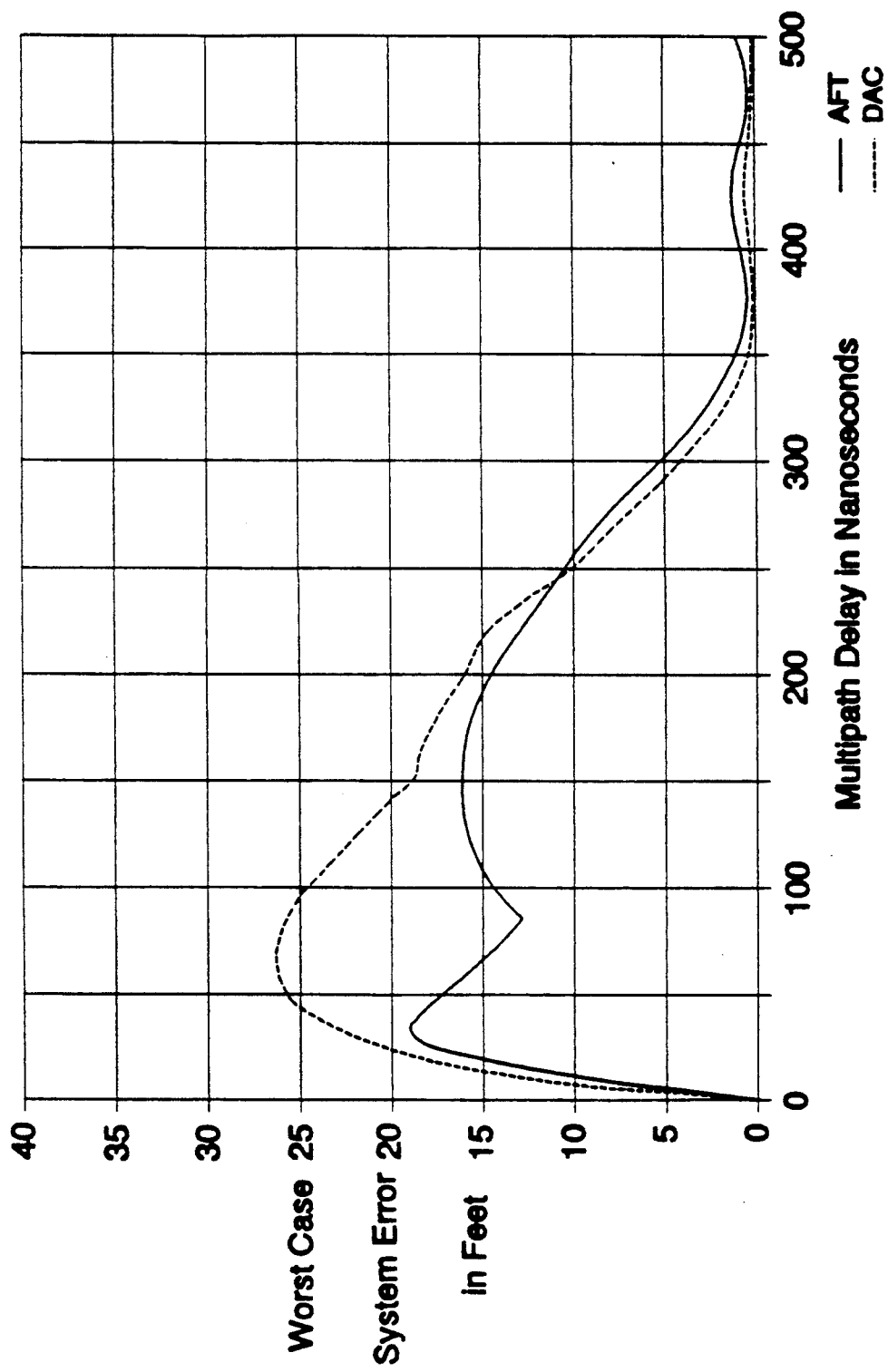
FIG. 7A is a graph showing worst case system error as a function of multipath delay for both AFT and DAC pulse time-of-arrival estimators.
Figure 7B:
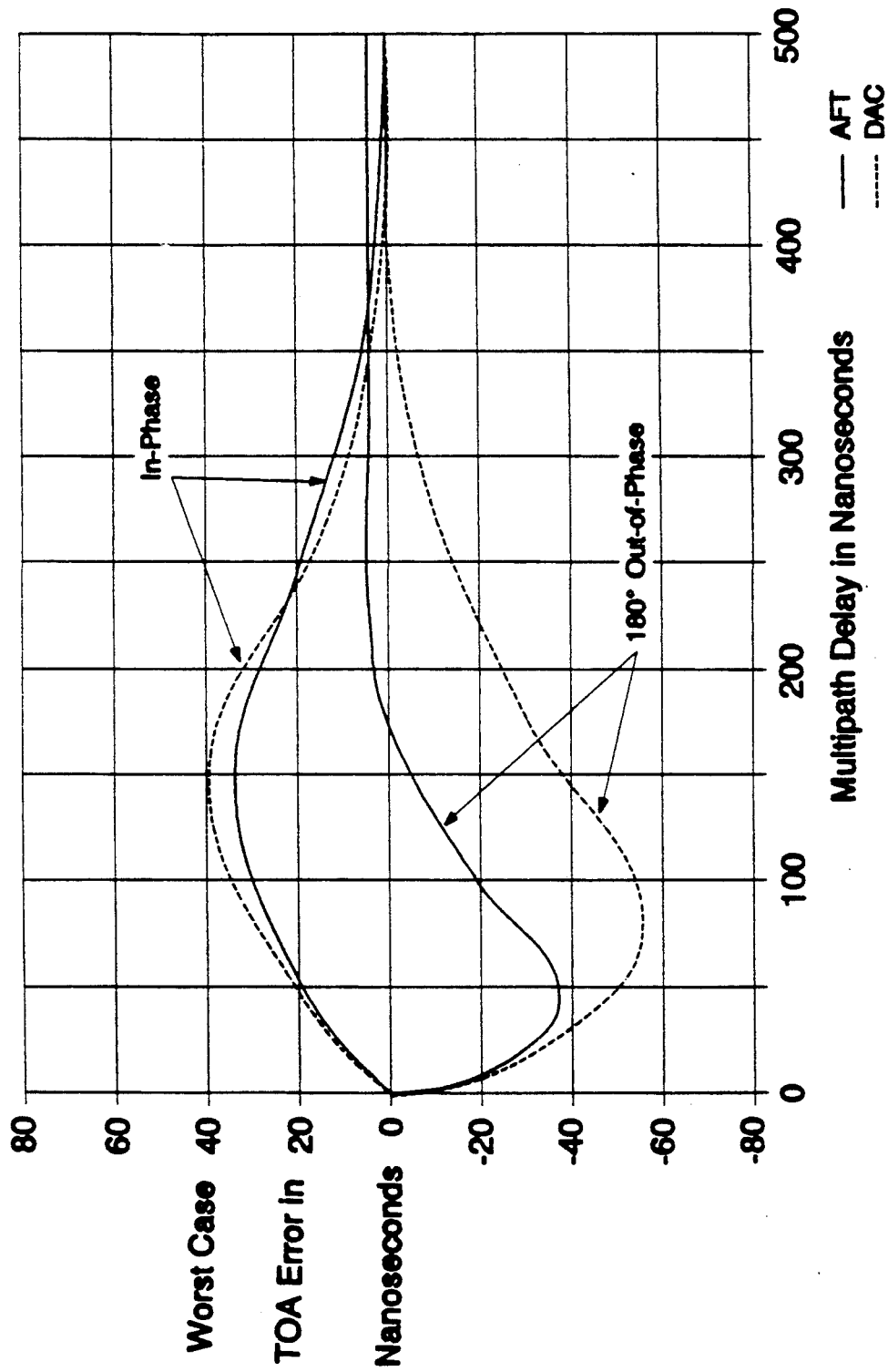
FIG. 7B is a graph showing worst case pulse time-of-arrival estimation error as a function of multipath delay for both AFT and DAC pulse time-of-arrival estimators.

FIG. 4A is a block diagram of the system employed to collect the experimental data used to generate the slope/adjustment time reference table. Typically, the pulse data collection system employs a reference pulse generator producing pulses having a rise time of 1000 ns. The output of the reference pulse generator is compared to input pulses having a range of rise times (typically from 800 to 1200 ns) with and without multipath interference. The multipath interference has a range of delays to simulate multipath errors (typically between 0 and 2200 ns of delay) having a phase switched between being in-phase with the reference pulse, to being 180° out-of-phase with the reference pulse. Because the DME/P multipath environment is well defined, the multipath corrupted input pulses cover the full range of expected multipath deviations and adjustment times. A single third-order polynomial curve is then fit onto the results of the data generation process; thus integrating the data collected into one continuous function (see FIG. 4B). From this third-order polynomial function, a function relating measured slope, $S_M$, to pulse adjustment time error derived. FIG. 5 provides a graphic representation of the $S_M$ vs. adjustment time function. It is just such information which is typically stored in the Input Pulse Adjustment Time Reference Module In summary, the AFT TOA estimator, like the DAC TOA estimator, compensates for amplitude and pulse shape variations. However, it is more effective in suppressing the effects of receiver noise and multipath errors than its DAC counterpart. Unlike a DAC estimator, the AFT estimator corrects all multipath induced error perturbation at any delay and multipath level up to $-3$ dB. FIG. 6 compares the $-3$ dB multipath performance of the AFT estimator breadboard hardware with the functionally identical computer emulation of the AFT estimator. FIGS. 7A and 7B show the improvement in system performance afforded over a typical DAC TOA estimator by the invention.

It will be understood that the particular embodiments described above are only illustrative of the principles of the present invention, and that various modifications could be made by those skilled in the art without departing from the scope and spirit of the present invention, which is limited only by the claims that follow.

What is claimed is:

1. A pulse time-of-arrival estimator comprising:

an amplifier coupled to receive and amplify a pulse waveform, said amplifier having an automatic gain control which normalizes the incoming pulse so that the peak amplitude of said amplified pulse are maintained within fixed limits;

a first responsive threshold detector having an input and an output, coupled to receive the pulse waveform output by the amplifier, said first threshold detector being responsive to the amplitude of the incoming pulse waveform so that upon the pulse waveform reaching a predetermined first amplitude level, $A_1$, said detector outputs a signal indicative of the time, $t_1$, at which the this first level was attained;

a second responsive threshold detector having an input and an output, coupled to receive the pulse waveform output by the amplifier, said second threshold detector being responsive to the amplitude of the incoming pulse waveform so that upon the pulse waveform reaching a predetermined second amplitude level, $A_2$, which is greater than said first amplitude level, said detector outputs a signal indicative of the time, $t_2$, at which the said second level was attained;

a slope calculating means coupled to receive the signals output by the first and second threshold detectors, and being responsive to the reception of said signals so as to calculate a slope ]value according to the formula $((A_2 - A_1)/(t_2 - t_1))$, and output a signal indicative of said slope value;

a means for storing an addressable array of adjustment time values, each of said adjustment time values being addressable by a corresponding slope value;

a retrieval means coupled to said storage means and said slope calculating means, responsive to the reception of the signal indicative of the calculated slope value from the slope calculating means so as to retrieve and output the corresponding time adjustment value from said storage means;

a calculating means coupled to receive the rime adjustment value from the retrieval means, and the signal from the first detector means indicative of the time at which the pulse waveform attained the first amplitude level, said calculating means being capable of outputting a value equal to the sum of the time at which the pulse waveform attained the first amplitude level and the adjustment time value retrieved from said storage means.

2. The pulse time-of-arrival estimator of claim 1 wherein:

the predetermined first amplitude level, $A_1$, to which the first responsive threshold detector is calibrated, is equal to approximately 10 percent of the peak amplitude of a normalized pulse output by the amplifier; and the predetermined second amplitude level, $A_2$, to which the second responsive threshold detector is calibrated, is equal to approximately 16 percent of the peak amplitude of a normalized pulse output by the amplifier.

3. The pulse time-of-arrival estimator of claim 1 wherein the amplifier normalizes the incoming pulse waveform to a peak amplitude of approximately 1 volt.

* * * * *